United States Patent [19]
Zhou

[11] Patent Number: 5,714,914
[45] Date of Patent: Feb. 3, 1998

[54] HIGH-POWER LOW-NOISE VOLTAGE-CONTROLLED OSCILLATOR

[75] Inventor: Xue-Song Zhou, Chapel Hill, N.C.

[73] Assignee: Ericsson Inc., Research Triangle Park, N.C.

[21] Appl. No.: 395,882

[22] Filed: Feb. 28, 1995

[51] Int. Cl.⁶ ............................................. H03B 5/12
[52] U.S. Cl. ............. 331/117 R; 331/175; 331/177 V; 331/108 R
[58] Field of Search ................... 331/167, 117 R, 331/175, 177 V, 109, 108 R; 332/123, 124; 330/292

[56] References Cited

U.S. PATENT DOCUMENTS

| | | | |
|---|---|---|---|
| 4,134,085 | 1/1979 | Driscoll et al. | 331/116 R |
| 4,511,861 | 4/1985 | Bell | 331/108 R |
| 4,571,557 | 2/1986 | Brandt | 331/96 |
| 4,590,443 | 5/1986 | Ishigaki et al. | 331/117 R |
| 4,593,255 | 6/1986 | Matsuura | 331/117 R |
| 5,144,264 | 9/1992 | Chong et al. | 331/117 R |
| 5,160,902 | 11/1992 | Saeki et al. | 331/117 R |

FOREIGN PATENT DOCUMENTS 2 274 033   7/1994   United Kingdom.

OTHER PUBLICATIONS

"Balanced Meissner Oscillator Circuits" by Nickdemma, RF Design, Dec. 1993, pp. 72–74.

J. L.H. OOI, "Low Voltage VCO with Differential Control Voltage for Wideband Tuning," Motorola Technical Developments, vol. 9, p. 75 (Aug. 1989).

Y. Tarusawa et al., "Low–Noise 2–GHz–Band VCO Implementation for Frequency Synthesizers Used in Land Mobile Radio," Transactions of the Institute of Electronics, Information and Communication Engineers of Japan, vol. E72, No. 10, pp. 1111–1118 (Oct. 1, 1989).

*Primary Examiner*—Robert Pascal
*Assistant Examiner*—Arnold Kinkead
*Attorney, Agent, or Firm*—Burns, Doane, Swecker & Mathis, LLP

[57] ABSTRACT

A high power, low noise voltage-controlled oscillator (VCO) eliminates the drive-stage amplifier and costly surface-acoustic wave (SAW) inter-stage filter in a transmitter such as a cellular radiotelephone. The VCO includes a resonant circuit, an active part connected to the resonant circuit, and a buffer amplifier, connected to the active part, for isolating the VCO from a load connected to the buffer amplifier. The active part includes at least one transistor in a Colpitts configuration; capacitances connected in parallel with junction capacitances of the transistor, each capacitance having a value that is greater than a value of the respective junction capacitance with which it is connected in parallel; and a resistance for providing negative feedback at low frequencies. A second resistance may be provided for reducing the gain of the active part when oscillation starts. The buffer amplifier is a linear amplifier including a transistor, and the active part and the buffer amplifier may be connected by a capacitance for reducing coupling between the active part and the buffer amplifier.

9 Claims, 5 Drawing Sheets

HIGH-POWER LOW-NOISE VOLTAGE-CONTROLLED OSCILLATOR

BACKGROUND

Applicant's invention relates to electronic oscillators and voltage-controlled oscillators.

A voltage-controlled oscillator (VCO) is a device for generating a signal having a frequency that can be varied in response to a control signal. Besides serving as stand-alone devices, VCOs are often components of phase-locked loops, voltage-to-frequency converters, etc.

A conventional transmitter used in a cellular radio telephone or a portable terminal typically includes a VCO for generating a low-power carrier signal, a drive-stage amplifier, an inter-stage filter that may be either a ceramic or a surface-acoustic-wave (SAW) device, and a power amplifier for boosting the power of the carrier to the appropriate level. In the typical transmitter, the drive-stage amplifier is needed to raise the VCO's low power output (typically 0 dBm or less) to a level appropriate for the power amplifier, and the inter-stage filter is needed to remove the noise produced by the drive-stage amplifier outside the spectral band of interest.

The out-of-band noise power generated by the drive-stage amplifier is usually relatively high. If this noise power were to pass through the power amplifier, the amplified out-of-band noise power would be almost impossible to remove with commercially available filters that meet the requirements of the Electronic Industries Association (EIA). Hence, inter-stage filters are necessary in current, typical transmitters.

Ceramic or SAW inter-stage filters are costly parts and are not suited for fabrication by current integrated circuit (IC) technology. At present, a cellular transmitter can be implemented on a single IC chip, except for the ceramic or SAW inter-stage filter. Therefore, to reduce the transmitter's cost and to integrate the whole transmitter on a single IC chip, it is desirable to eliminate the interestage filter.

One way to eliminate the inter-stage filter is to use a VCO having a higher power output. In fact, using a high-power VCO also permits elimination of the drive-stage amplifier, provided the noise power output of the high-power VCO is low. A VCO's noise power output is largely the result of two components: phase noise and amplitude noise.

In the past, it was common to ignore the VCO's noise performance at frequencies far from the carrier's frequency, e.g., 45 MHz away from the carrier's frequency, because noise far from the carrier would be filtered out by the inter-stage filter. The noise far from the carrier is usually treated as amplitude-modulation (AM) noise. The fact is that the noise far from the carrier is a combination of AM noise and phase noise, as well as intermodulation sideband noise that arises from the highly non-linear operation of the VCO's active devices.

One of the most important characteristics of a VCO is the short-term frequency stability, or phase noise. Among the noise sources that dominate the phase noise performance of a VCO are flicker noise, shot noise, and thermal noise of the VCO's active devices. The low-frequency noise, or 1/f noise, modulates the signal generated by the VCO, forming noise side-bands that are spectrally very close to the carrier signal's frequency. The thermal noise contributes to the phase noise through a conversion from AM to phase modulation.

To achieve low phase noise, active devices that have low 1/f noise and low noise figure, which includes the thermal noise contribution, are needed. Since both the 1/f noise and thermal noise of the active devices depend on the d.c. bias currents flowing through them, a VCO should use low d.c. bias currents to achieve low noise. Unfortunately, using low d.c. bias currents is the reason that most low-noise VCOs generate only limited output power.

Using larger d.c. bias currents is the usual way of obtaining a VCO having high output power. For cellular communications, however, the VCO's noise performance deteriorates to a point where a costly high-Q resonator must be provided for reducing the phase noise. The minimal Q-factor that is sufficient is usually determined to avoid unnecessarily increasing the cost of the VCO, but the cost still increases.

As described above, VCOs are typically used for generating carrier signals in radio telephony. One current standard for cellular mobile telephone systems using analog frequency modulation (FM) of a radio-frequency (RF) carrier signal is the Advanced Mobile Phone Service (AMPS) system in the U.S. that uses wideband FM having a spacing of 30 KHz between carrier signals having frequencies around 900 MHz. A digital AMPS (D-AMPS) system has also been introduced in the U.S. that uses carrier signals in the 900-MHz band. Some of the characteristics of the AMPS system are specified by the EIA/TIA-553 standard published by the Electronic Industries Association and Telecommunications Industry Association (EIA/TIA).

Another analog-FM standard is the Total Access Communications System (TACS) in the United Kingdom that uses spacings of 25 KHz between carrier signals having frequencies around 900 MHz. A third analog-FM standard is the Nordic Mobile Telephone (NMT) system in Scandinavia that uses FM having spacings of 12.5 KHz between carriers in the 450-MHz and 900-MHz bands.

The capacity of such analog FM systems can be increased by reducing the channel bandwidth, as in a narrow-band FM system according to the N-AMPS specification. In an N-AMPS system, a channel spacing of 10 KHz is achieved by splitting each 30-KHz-wide radio channel of an AMPS system into three parts. In general, a radio channel is a bi-directional radio transmission path between two transceivers, and thus the channel comprises two carriers having different frequencies, one for uplink communication (mobile station to base station) and one for downlink communication (base station to mobile station). In the standard systems, the frequency spacing between the two carriers of any radio channel is 45 MHz.

In other efforts to increase system capacity, a digital AMPS (D-AMPS) system in the U.S. uses digital transmission and time-division multiple access (TDMA) on traffic channels while keeping analog transmission on control channels. Some of the characteristics of the D-AMPS system are specified by the IS-54B standard published by the EIA/TIA. Other current TDMA communication systems are the American Digital Cellular System (ADC) in North America and the Global System for Mobile Communications (GSM) in Europe, as well as systems in Japan. Communication systems also are available that use RF carrier signals and code division multiplexing (CDM) and code division multiple access (CDMA).

SUMMARY

In accordance with Applicant's invention, a circuit topology is provided that results in a VCO having high output power and low noise using a low-Q resonator. Such a VCO comprises a resonant circuit; an active part that is connected to the resonant circuit and that includes at least one transistor connected in a Colpitts configuration; and a buffer amplifier, connected to the active part, for isolating the VCO from a load connected to the buffer amplifier.

The active part includes capacitances connected in parallel with junction capacitances of the transistor, each capacitance having a value that is greater than a value of the respective junction capacitance with which it is connected in parallel, and a first resistance for providing negative feedback at low frequencies. At least two of the capacitances enhance feedback in the active part at high frequencies and suppress feedback in the active part at low frequencies and compensate for changes in the junction capacitances.

The active part may include a plurality of transistors connected in parallel in a Colpitts configuration for reducing a value of a d.c. current passing through each respective transistor. The active part may further include a second resistance for reducing a gain of the active part when oscillation starts.

The buffer amplifier is a linear amplifier including a transistor, and the active part and the buffer amplifier are connected by a capacitance for reducing coupling between the active part and the buffer amplifier.

In another aspect of Applicant's invention, a VCO comprises a resonant circuit; an active part that is connected to the resonant circuit and that includes at least one transistor connected in a Colpitts configuration; a linear buffer amplifier, including a transistor, for isolating the VCO from a load connected to the buffer amplifier; and a capacitance for connecting the active part and the linear buffer amplifier and for reducing coupling between the active part and the buffer amplifier.

The active part includes capacitances connected in parallel with junction capacitances of the transistor, each capacitance having a value that is greater than a value of the respective junction capacitance with which it is connected in parallel; a first resistance for providing negative feedback at low frequencies; and a second resistance for reducing a gain of the active part when oscillation starts. The active part may include a plurality of transistors connected in parallel in a Colpitts configuration for reducing a value of a d.c. current passing through each respective transistor.

BRIEF DESCRIPTION OF THE DRAWINGS

Applicant's invention is described below in more detail with reference to embodiments that are given only by way of example and that are illustrated in the accompanying drawings, in which.

DETAILED DESCRIPTION

Figure 1:
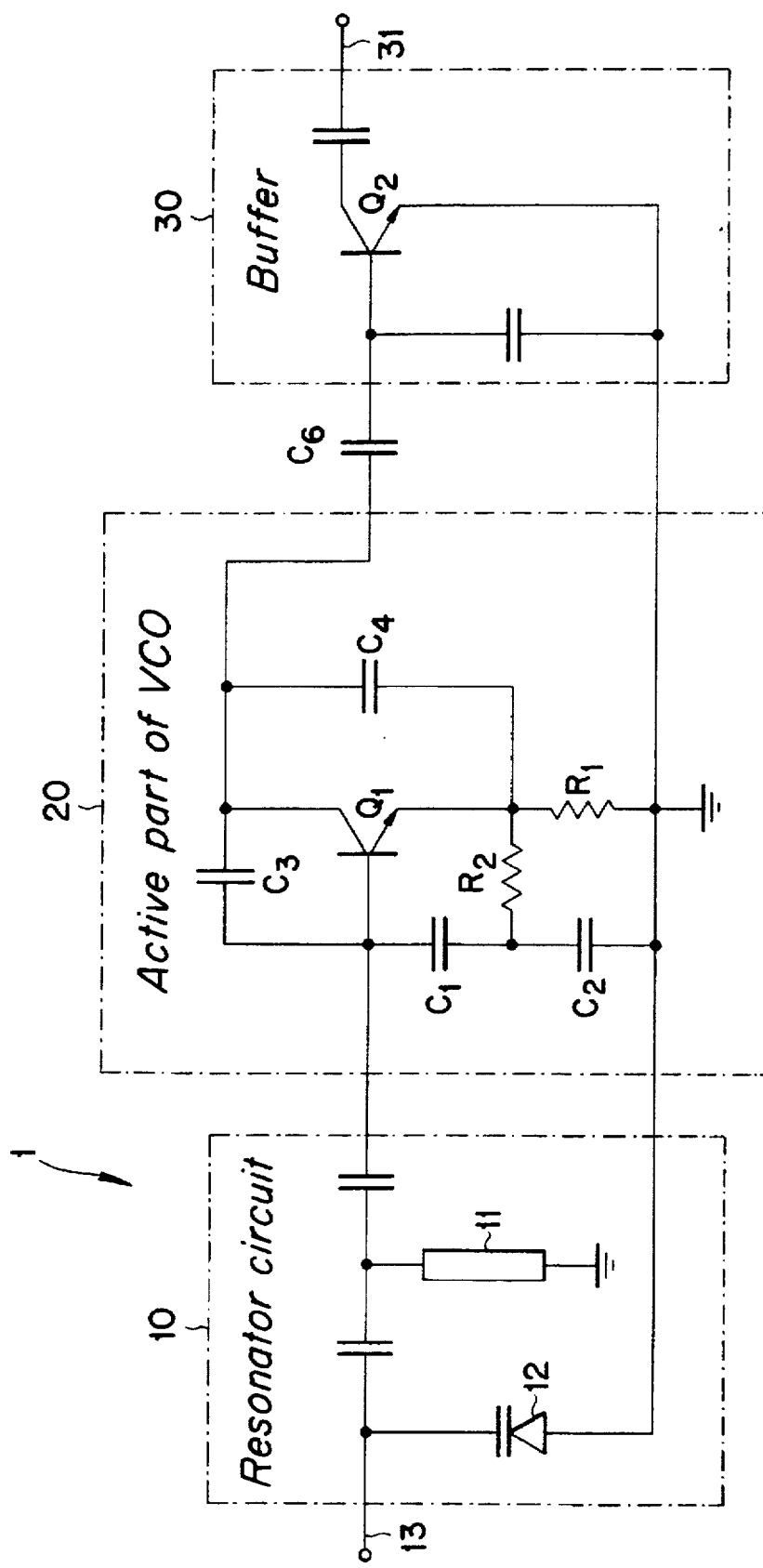
FIG. 1 is an electrical schematic diagram of a voltage-controlled oscillator in accordance with Applicant's invention.

While the following description is in the context of cellular communication systems involving portable or mobile radiotelephones and/or personal communication networks, it will be understood by those skilled in the art that Applicant's invention may be applied in other areas where VCOs are employed. FIG. 1 is an electrical schematic diagram of a VCO 1 in accordance with Applicant's invention that has a common, low-Q resonator for providing gain at the resonant frequency to an active part of the VCO. The VCO 1 comprises a resonator 10, an active part 20, and a buffer amplifier stage 30. The active part 20 is similar in some respects to a Colpitts oscillator, but the circuit 20 has significant additional components: capacitances $C_3$, $C_4$ and resistance $R_2$. The importance of these components and the advantages provided by them are explained below.

As described above, the two major parts of a VCO's noise spectrum are phase noise and AM noise. At frequencies close to the frequency of the VCO's output signal, the phase noise dominates, while at frequencies very far from the output signal's frequency, AM noise dominates. At frequencies not too far from the output signal's frequency, the VCO's noise spectrum is a combination of phase noise and AM noise; which one is higher depends on the noise characteristics of the VCO's active and passive components, on how non-linear is the operation of the active devices, and on the circuit topology.

As is well known, the phase noise arises from low-frequency modulation of the output signal arising from the non-linear transconductance, $g_m$, and non-linear junction capacitances, $C_{be}$, $C_{bc}$, $C_{ce}$, of the active part's transistor $Q_1$. If the non-linear modulation on these non-linear elements is reduced, the phase noise is reduced accordingly. In accordance with one aspect of Applicant's invention, the active part 20 includes capacitances $C_3$, $C_4$ that are connected in parallel with each nonlinear junction capacitance. Thus, the linear capacitances $C_3$, $C_4$, as well as conventional capacitance $C_1$, reduce the non-linear modulation. To achieve optimum results, these capacitances should be selected such that $C_3 > C_{bc}$, $C_4 > C_{ce}$, and $C_1 > C_{be}$.

Furthermore, the capacitances $C_3$, $C_4$ enhance the feedback at high frequencies and suppress the feedback at low frequencies, especially at the onset of oscillation, which is advantageous for reasons described below. In this application, "high" frequencies are frequencies that are at least approximately equal to the frequency of the carrier signal, i.e., the output signal generated by the VCO. "Low" frequencies are frequencies between d.c. (0 Hz) and about 100 KHz, for bipolar junction transistors (BJTs), or between d.c. and about 100 MHz, for field effect transistors (FETs).

Another benefit of using capacitances $C_3$, $C_4$ is the improvement of pushing effect and temperature stability of the VCO 1 because the capacitances $C_3$, $C_4$ reduce the effect of device capacitance changes with variation of supply voltage as well as variation of temperature.

The VCO's performance may be further improved, if necessary, by selecting the Q-factor of the conventional resonator 10 to reduce the phase noise appropriately. The resonator 10 typically would have a Q-factor that is selected to be just sufficient for meeting the desired noise performance. It is believed a resonator 10 having a Q-factor of only about 100 is suitable for cellular telephony as described below. Resonator 10 can be constructed from a microstrip line 11 and a commercially available, low-cost varactor 12, such as those from Toko, Toshiba, and Alpha. The microstrip line can be replaced by a coaxial inductor, such as those that are commercially available from Trans-Tech. The bias voltage applied across the varactor 12, for example via a control signal terminal 13, can be used to control the frequency of the signal generated by the VCO 1, as can changes in the parameters of element 12. It will be appreciated that the coupling between the resonator 10 and the active part 20 should be reduced in order to increase the resonator's Q-factor.

In Applicant's low-noise VCO 1, the active part 20 includes a resistance $R_1$ for introducing negative feedback at low frequencies to suppress the gain and noise at low frequencies while a capacitance $C_2$ maintains the gain at high frequencies, i.e., near the carrier frequency. As a result, the VCO's phase noise is reduced and its stability at low frequencies is enhanced because most transistors that would be used as transistor $Q_1$ have very high gain at low frequencies, which usually causes increased low-frequency noise and decreased low-frequency stability.

As described above, a low-noise VCO usually requires low d.c. bias current, so the VCO's output power is also low, and high-current operation for high output power results in high phase noise and AM noise. To obtain a high power level and also keep the d.c. bias current as low as possible, the transistor $Q_1$ may be implemented as two or more transistors connected in parallel. In this way, the d.c. current passing through each transistor is reduced (by half, if a pair of transistors are used), and as a result, the total noise level is lower than that of a single transistor $Q_1$ operating at the same output power level.

How many parallel-connected transistors should be used depends on the technology in the IC processing, the output power level required, and the optimal bias point of a single transistor for optimal noise figure and optimal low-frequency noise. For example, BJTs such as silicon BJTs and gallium arsenide HBTs have lower 1/f noise than FETs such as MESFETs and HEMTs. An application like a cellular radiotelephone transmitter might use two BJTs or three FETs.

In general, the oscillation of a VCO started with low gain will have lower noise than the oscillation of a VCO started with high gain. Therefore, in accordance with one aspect of Applicant's invention, the resistance $R_2$ in conjunction with the other elements, such as capacitances $C_3$, $C_4$, $C_2$, and $C_1$, reduces the gain at the moment oscillation starts.

Applicant's VCO 1 also includes a buffer amplifier stage 30 for isolating the VCO from loading by the next stage connected to the buffer's output terminal 31, thereby avoiding any output signal frequency pulling due to changes in load impedance. From the point of view of low noise, the buffer amplifier 30 should operate as linearly as possible in order to avoid added noise from intermodulation arising in the buffer stage. It will be understood that the linear operation of the buffer amplifier 30 is determined by the operating point of the buffer's transistor $Q_2$, and that operating point is determined by the transistor's d.c. bias and load impedance.

The active part 20 and the buffer stage 30 are connected by a small capacitance $C_6$ having a capacitance value such that the coupling between the active part and the buffer stage is reduced and load-induced frequency pulling is reduced.

Applicant's high power, low noise VCO 1 has been simulated with a commercially available microwave/RF circuit simulator, HP-EEsof's J-Omega simulator, in conjunction with an HBT non-linear device model available from RF Micro Devices. The resonator circuit in the simulation had a loaded Q-factor (50-ohm load) of approximately 100.

As shown in FIGS. 2–5, the simulation met expectations regarding output power level and phase noise near the carrier as well as the total noise power level in the receive band, 45 MHz away from the carrier. These expectations could not be met using conventional circuit topologies with the same resonator circuit. The simulated circuit provided more than 10 dB improvement in noise performance compared to conventional VCO circuits. As noted above, the noise performance of a conventional VCO is usually specified only for close-in phase noise, i.e., phase noise at frequencies 25–30 KHz away from the carrier, depending on system bandwidth. Since Applicant's high power, low noise VCO eliminates the costly, bulky inter-stage filter, the VCO's noise performance must meet a further specification: noise power in the receive band.

For example, typical requirements for a cellular radiotelephone transmitter are an output power of +30 dBm, a power gain of 15 dBm, a noise figure of 5 dB, and a noise power of less than −139.8 dBm/Hz at 45 MHz above the carrier frequency. Accordingly, the noise power produced by the VCO must be less than −(15+5+139.8)=−159.8 dBm/Hz at 45 MHz above the carrier, which is a performance specification that is extremely difficult to meet with a conventional VCO, even one that meets the output-power and close-in-noise specifications.

It will be understood, of course, that the particular values of the resistances $R_1$, $R_2$; capacitances $C_1$–$C_6$; and transistor bias currents are determined by the particular application in which Applicant's VCO is used. In general, resistance $R_1$ could have a value between about 30 ohms and about 200 ohms; resistance $R_2$ could have a value between about 2 ohms and about 10 ohms; the d.c. current through transistor $Q_1$ could have a value between about 10 milliamps and 20 milliamps; and the d.c. current through transistor $Q_2$ could have a value between about 20 milliamps and 40 milliamps. These ranges are not to be taken as limiting Applicant's invention because which values are optimal depends on the requirements for output power and phase noise, as well as for noise power at the particular frequency far from the carrier frequency.

Figure 2:
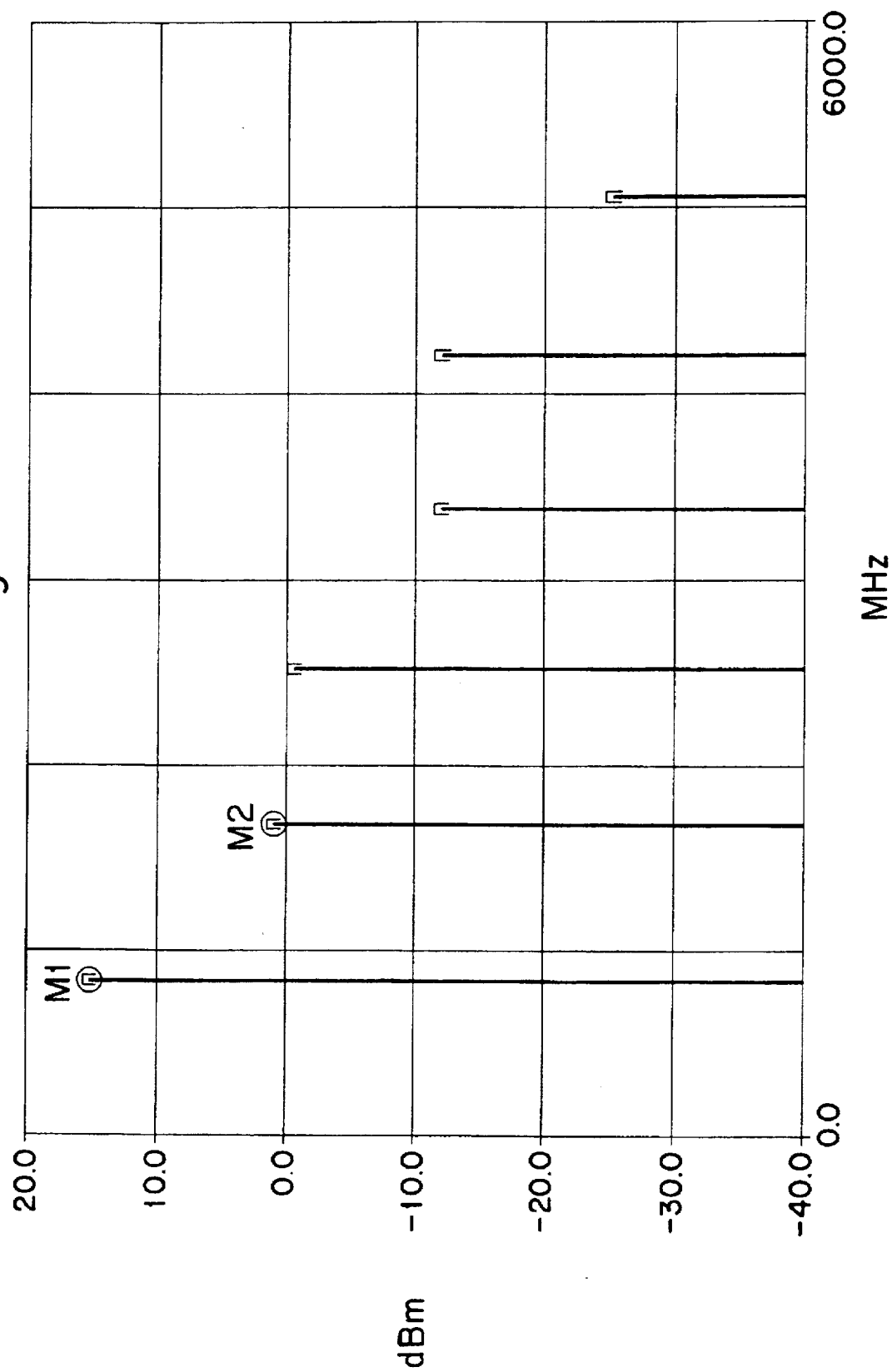
FIG. 2 shows the output power spectrum of the circuit of FIG. 1.

FIG. 2 shows the output power spectrum of the simulation. The output power level was +15.3 dBm at the fundamental frequency of the carrier, which was about 843 MHz, and was only about +0.9 dBm at the first harmonic (1686 MHz) of the carrier.

Figure 3:
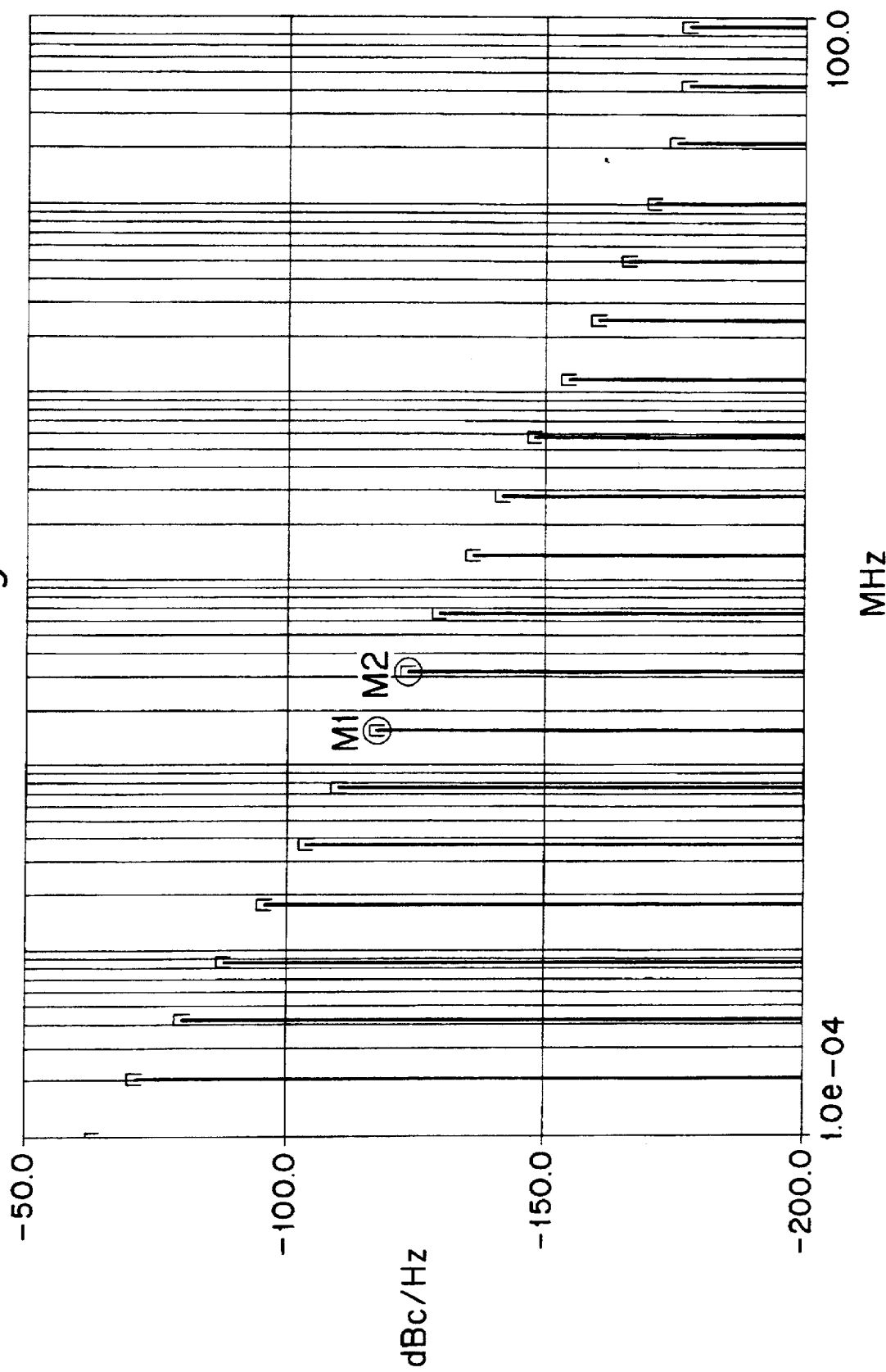
FIG. 3 shows the phase noise of the circuit of FIG. 1.

FIG. 3 shows the phase noise power spectrum of the simulation, where phase noise power level is plotted as a function of the logarithm of the frequency offset from the carrier signal's frequency. At 32 KHz away from the carrier, the phase noise power was less than −122.7 dBc/Hz, which is considerably better than the maximum acceptable phase noise level of −95 dBc/Hz. At 16 KHz frequency offset from the carrier, the phase noise power was −116.3 dBc/Hz. In addition, FIG. 3 shows the phase noise level at 20 MHz away from the carrier was approximately −175 dBc/Hz, which is considerably better than the maximum acceptable phase noise level of −163 dBc/Hz in a GSM-standard cellular telephone system.

Figure 4:
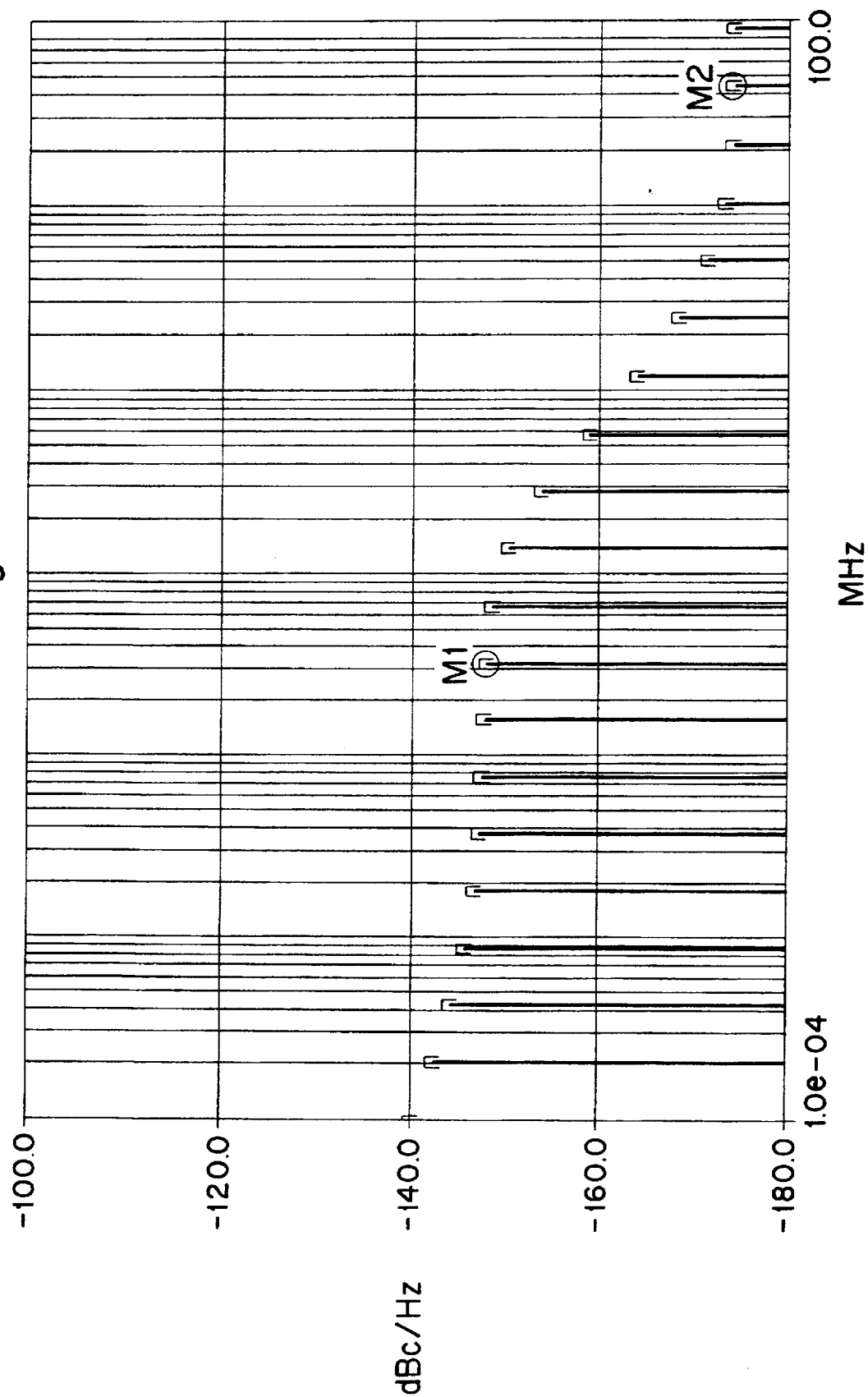
FIG. 4 shows the AM noise spectrum of the circuit of FIG. 1.

FIG. 4 shows the AM noise spectrum of the simulated VCO, where AM noise power level is plotted as a function of the logarithm of the frequency offset from the carrier signal's frequency. Comparing FIGS. 3 and 4 indicates the relative noise contributions from phase noise and AM noise. FIG. 4 shows the AM noise power was −147.9 dBc/Hz at a 32 KHz frequency offset from the carrier, and −174.1 dBc/Hz at 44 MHz from the carrier.

Figure 5:
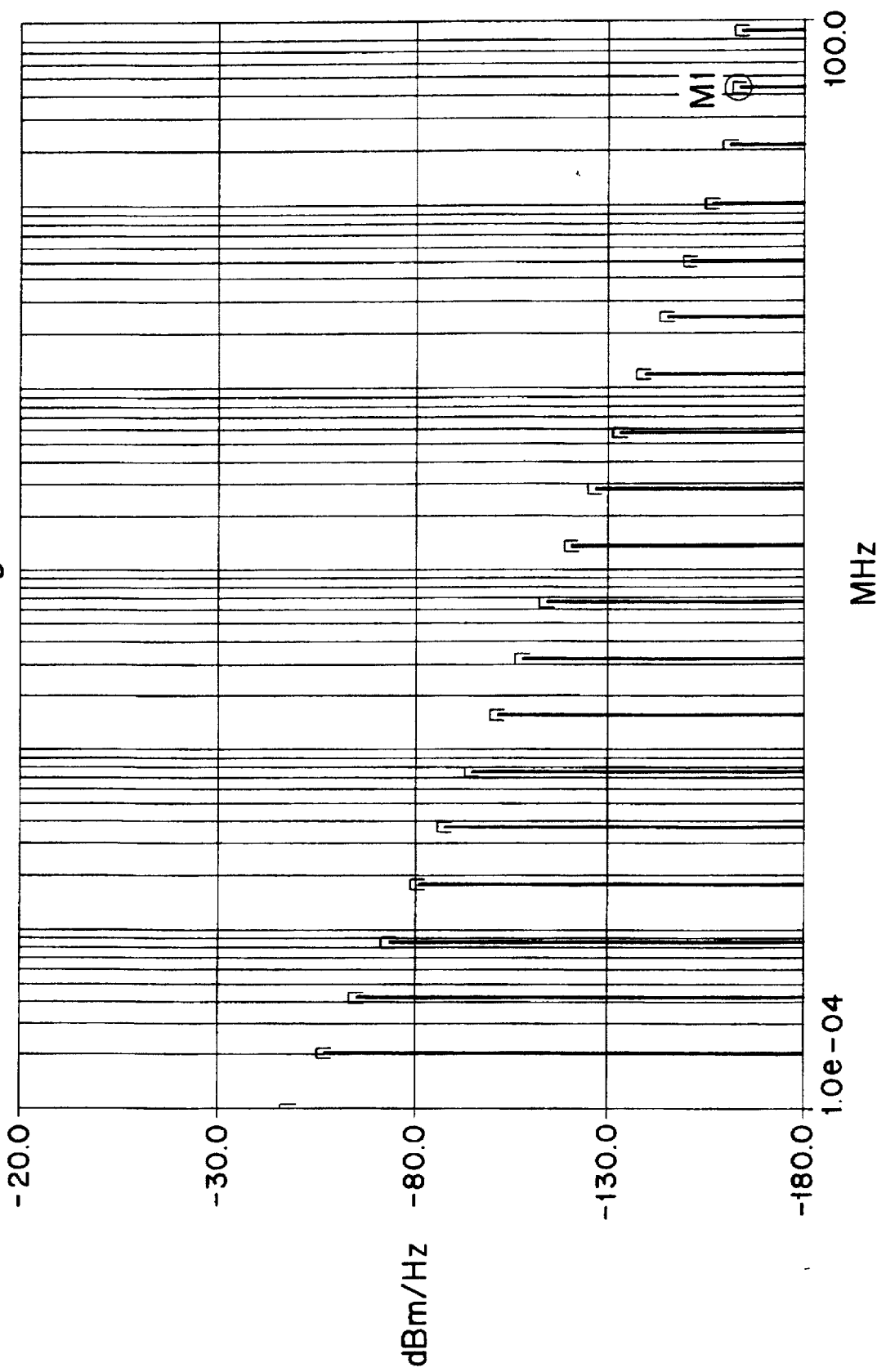
FIG. 5 shows the noise power level of the circuit of FIG. 1.

In most radiotelephone systems, the most difficult performance standard to meet is the noise power level in the receive band, viz. the noise power level at 45 MHz away from the carrier. FIG. 5 shows the combined phase-and-AM noise spectrum of the simulated VCO, where the combined noise power level is plotted as a function of the logarithm of the frequency offset from the carrier signal's frequency. FIG. 5 shows that this noise power level was −163.1 dBm/Hz at 44 MHz frequency offset from the carrier, which is less than the maximum level of −160 dBm/Hz permitted by the AMPS specification. The best receive-band noise power level reached by simulating conventional VCO circuits was −150 dBm/Hz.

Applicant's invention provides a new circuit topology for a high-power, low-noise VCO that can replace the driver-stage amplifier and the costly, high quality ceramic filter or SAW filter in a transmitter circuit. Because of its simplicity and the absence of a bulky filter, a VCO in accordance with Applicant's invention is easy to fabricate with a power amplifier on a single IC chip. Fabricating the VCO with the power amplifier on a single chip can significantly reduce product cost.

While particular embodiments of Applicant's invention have been described and illustrated, it should be understood that the invention is not limited thereto. For example, Applicant's invention can be applied to any transistor-type, or three-terminal-type, oscillator, all of which are expressly intended to be included in the term "VCO" as used in this application. This application contemplates any and all modifications that fall within the spirit and scope of Applicant's invention as defined by the following claims.

What is claimed is:

1. A high power, low noise voltage-controlled oscillator (VCO), comprising:

a resonant circuit;

an active part that is connected to the resonant circuit and that includes at least one transistor connected in a Colpitts configuration; and a buffer amplifier, connected to the active part, for isolating the VCO from a load connected to the buffer amplifier;

wherein the active part includes capacitances connected in parallel with junction capacitances of the at least one transistor, the capacitances suppressing feedback at low frequencies and each capacitance having a value that is greater than a value of the respective junction capacitance with which it is connected in parallel, and a first resistance for providing negative feedback to suppress gain and noise at low frequencies, the low frequencies being far from VCO's oscillation frequency.

2. The VCO of claim 1, wherein at least two of the capacitances enhance feedback in the active part at high frequencies and suppress feedback in the active part at low frequencies.

3. The VCO of claim 1, wherein at least two of the capacitances compensate for changes in the junction capacitances.

4. The VCO of claim 1, wherein the active part comprises a plurality of transistors connected in parallel in a Colpitts configuration for reducing a value of a d.c. current passing through each of the plurality of transistors.

5. The VCO of claim 1, wherein the active part further includes a second resistance for reducing a gain of the active part when oscillation starts.

6. The VCO of claim 1, wherein the buffer amplifier is a linear amplifier including a transistor.

7. The VCO of claim 1, wherein the active part and the buffer amplifier are connected by a capacitance for reducing coupling between the active part and the buffer amplifier.

8. A voltage-controlled oscillator (VCO), comprising:

a resonant circuit;

an active part that is connected to the resonant circuit and that includes at least one transistor connected in a Colpitts configuration;

a linear buffer amplifier, including a transistor, for isolating the VCO from a load connected to the buffer amplifier; and a capacitance for connecting the active part and the linear buffer amplifier and for reducing coupling between the active part and the buffer amplifier;

wherein the active part includes capacitances connected in parallel with junction capacitances of the at least one transistor, the capacitances suppressing feedback at low frequencies and each capacitance having a value that is greater than a value of the respective junction capacitance with which it is connected in parallel; a first resistance for providing negative feedback to suppress gain and noise at low frequencies; the low frequencies are far from the VCO's oscillation frequency; and a second resistance for reducing a gain of the active part when oscillation starts.

9. The VCO of claim 8, wherein the active part comprises a plurality of transistors connected in parallel in a Colpitts configuration for reducing a value of a d.c. current passing through each respective transistor.

* * * * *